April 1, 1969 S. LEVINOS ET AL 3,436,215

PHOTOPOLYMERIZATION INITIATED BY ELECTROLYSIS OF A CATALYST PROGENITOR EXPOSED THROUGH A PHOTOCONDUCTIVE LAYER

Filed Feb. 16, 1966

*INVENTOR.*
STEVEN LEVINOS
ALBERT S. DEUTSCH

*BY*

ATTORNEYS

United States Patent Office 3,436,215

Patented Apr. 1, 1969

3,436,215

PHOTOPOLYMERIZATION INITIATED BY ELECTROLYSIS OF A CATALYST PROGENITOR EXPOSED THROUGH A PHOTOCONDUCTIVE LAYER

Steven Levinos and Albert S. Deutsch, Vestal, N.Y., assignors to GAF Corporation, New York, N.Y., a corporation of Delaware Filed Feb. 16, 1966, Ser. No. 527,951
Int. Cl. G03g 7/00
U.S. Cl. 96—1 23 Claims

ABSTRACT OF THE DISCLOSURE

Process for the preparation of a polymeric resist image is described. A multilayered structure is provided comprising a photoconductive layer and a layer containing a vinyl monomer and a catalyst progenitor. These layers are sandwiched between two conducting layers. Simultaneous exposure to light and application of an electric field causes electrolysis of the catalyst progenitor to initiate polymerication of the monomer layer in the exposed areas.

Figure 1:
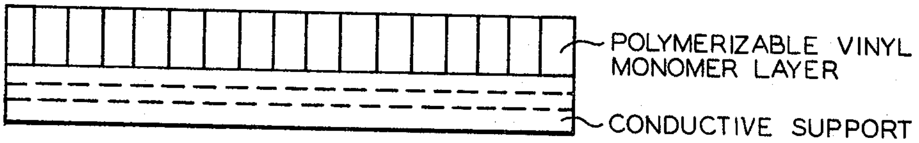

The present invention relates in general to the formation of solid polymers and more particularly, to a novel process for the production of polymeric resist images by a catalytically induced polymerization of a normally liquid to a normally solid monomeric vinyl compound.

It is well known that the polymerization of certain ethylenically unsaturated organic compounds, more commonly referred to as vinyl monomers, can be initiated by exposure to high intensity radiation to yield thereby a high molecular weight product. Thus, it is known that methyl acrylate on long standing in the sunlight, is transformed into a transparent, odorless mass of density 1.22 and, in this connection, reference is made to Ellis' "The Chemistry of Synthetic Resins" (vol. 2), 1935, p. 1072. Photography and the related fields of photolithography have proved to be particularly useful areas for the application of radiant energy to effect polymerization of vinyl monomer compositions. The general procedure involved comprises coating a suitable base or support with a polymerizable compound such as a monomer or mixtures of monomers followed by exposure through a pattern to a high intensity light source. In the exposed areas, the monomer is polymerized to a more or less hard and insoluble mass, depending upon the intensity of exposure, whereas the unexposed areas comprising substantially the original monomer(s) can be readily removed in most cases by a simple washing operation. There remains in the exposed areas a resist of insoluble polymer material.

Since the polymerization reaction characterizing such systems would ordinarily lack the requisite speed necessary for feasible commercial practice, the use of polymerization aids, e.g., photoinitiators, promoters, sensitizers and the like, is a recognized necessity. The absence of one or more of such auxiliary agents will invariably lead to the formation of only low molecular weight polymers.

Despite the relatively widespread commercial success of the photopolymerization process in the photoreproduction industry, certain difficulties are nevertheless repeatedly encountered and especially in connection with attempts to provide photopolymerizable monomer compositions possessing optimum spectral response, i.e., speed. It is commonly found that successful implementation of the photopolymerization technique which requires the formation of polymers of sufficient toughness and film strength, necessitates the use of inordinately long exposures and/or sources of high intensity radiation.

As will be readily apparent such a process depends critically for its success upon the photolytic effects of actinic radiation, i.e., the polymer-forming reaction results from the effects of light upon radiation sensitive monomer/catalyst systems. The rate and thus extent of polymer formation will primarily depend upon the amount of catalyst, e.g., free radicals, generated during the photolytic decomposition of the catalyst-liberating material which in turn depends upon the intensity of exposure to which the area in question is subjected. Several disadvantages are inherent in such a system. Firstly, the effective photographic speed of a given radiation sensitive catalyst/monomer system can be enhanced only by suitable adjustment of the radiation source itself (intensity) or by increasing the duration of exposure (time). This, of course, necessarily imposes certain conditions on the process equipment which can be effectively employed, e.g., the type of light source. Of paramount significance from a commercial standpoint, however, is the fact that the use of high intensity radiant energy sources invariably leads to defective image reproduction as well as other deleterious effects. For example, high intensity radiation sources of the type required in photopolymerization methods currently known produce large quantities of infra-red and heat rays which, as is well known, can exert catalytic effects and thus initiate as well as accelerate certain type of polymerizations. As a consequence, a certain portion of the monomer composition may be polymerized due to thermal effects alone which, of course, would tend to prohibit the production of a clean relief image. For example, should a black and white silver halide negative pattern be employed, it is obvious that no polymer should form in areas corresponding to the dark portions of the negative pattern. However, such a result may nevertheless occur since the dark portions of the negative may well absorb significant amounts of the radiant heat energy given off by the light source to an extent sufficient to effect thermal polymerization of monomer in the nonimage areas. Consequently, in those systems which utilize a light source having an appreciable radiant heat output, serious problems may arise in connection with the quality of resist images reproduced.

In an effort to overcome or otherwise alleviate the foregoing and related problems, considerable industrial activity has centered around the research and development of new and more efficient catalyst systems, i.e., photoinitiators, as well as catalyst promoters, sensitizing agents and the like. In addition, a substantial number of monomer systems have been provided heretofore which purportedly exhibit a marked improvement in spectral response thereby providing more feasible polymerization rates.

However, in the vast majority of instances, the innovations thus far evolved have provided only marginal advantage in such vital aspects as speed, image quality, etc., the latter shortcomings being particularly manifest in connection with photopolymerization techniques based upon the use of low energy radiation sources. For example, in an effort to extend as well as augment the spectral sensitivity of the known catalyst monomer systems which in many instances exhibit optimum response to but limited regions of the spectrum, it has been suggested to incorporate therein one or more sensitizing dyes. Since these materials, being dyestuffs, are only partially absorptive in the visible spectrum, the photopolymerizable composition will often be colored thereby. The consequences involved are self-evident. Furthermore, the increased costs involved in implementing such techniques have tended to retard significant degree of commercial exploitation.

As a result of the discovery forming the basis of the present invention, there is provided a completely novel method for effecting the imagewise polymerization of a vinyl monomer composition wherein the rate and degree of polymer formation is virtually independent of the photolytic effects of actinic radiation. Thus, the problems implicit in photopolymerization processes which are essentially photochemical in nature, e.g., spectral sensitivity, exposure intensity, etc. are irrelevant factors.

Accordingly, a primary object of the present invention resides in the provision of a method for effecting the polymerization of a vinyl monomer composition which is not subject to the above limitations and disadvantages.

Another object of the present invention resides in the provision of a high speed method for forming a polymeric resist by the imagewise polymerization of a vinyl monomer composition wherein the exposure intervals required are reduced to an extent heretofore unattainable with the methods currently known.

A further object of the present invention resides in the provision of a method for forming a polymeric resist image wherein the polymer-forming reaction is totally independent of the photolytic effects of actinic radiation.

A still further object of the present invention resides in the provision of polymeric resist elements characterized by outstanding improvement in reproduction quality.

Other objects of the present invention will become apparent hereinafter as the description thereof proceeds.

The attainment of the foregoing and related objects is made possible in accordance with the present invention which in its broader aspects includes the provision of a process for the formation of a polymer resist image characterized in that the imagewise generation of catalyst, i.e., polymerization-initiating species in the polymerizable monomer layer proceeds according to a reaction which is essentially electrolytic as distinguished from photolytic in nature, the activating influence being an electric current generated in accordance with a light pattern incident upon a photoconductive layer situated in electrically conducting contact with said polymerizable monomer layer.

The nexus of the present invention and that which represents the vital point of departure over photopolymerization methods totally dependent upon the photolytic effects of actinic radiation resides in the use of a polymerizable monomer layer containing a polymerization catalyst progenitor which, under the effects of an electric current, undergoes electrolysis resulting in the formation of the polymerization-initiating species. Accordingly, if an imagewise conductivity pattern be impressed upon such a layer, it will be readily evident that the catalyst population densities generated in accordance therewith will correspondingly determine the polymerization rate and thus the extent of polymer formation.

The method or process by which the present invention can be readily implemented can perhaps best be understood by reference to the accompanying drawing. However, it will be understood that the arrangement of parts depicted therein is given for purposes of illustration only and thus is in no way to be regarded as being limitative.

Figure 2:
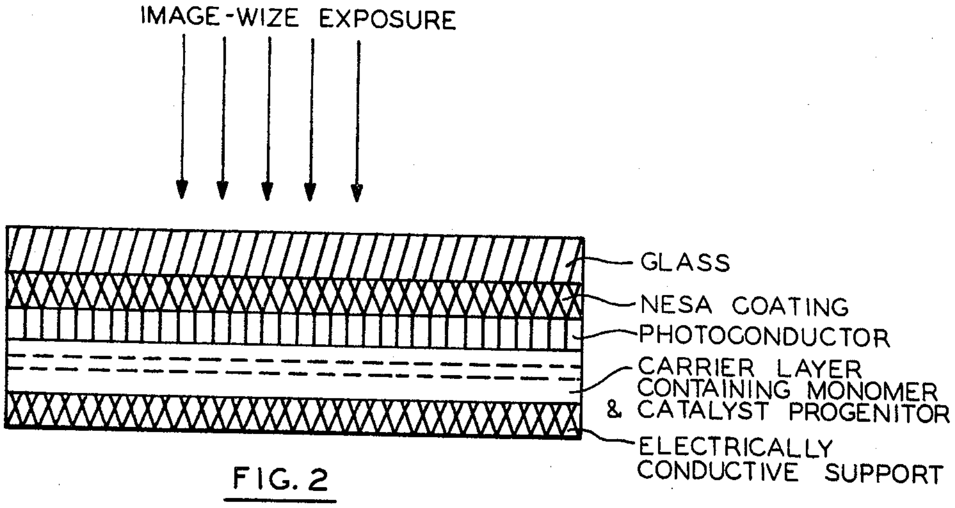

FIG. 1 illustrates one type of resist-forming element applicable to the process of the present invention while FIG. 2 illustrates a fundamental arrangement by which the electrolytically induced polymerization of the present invention may be readily achieved.

In FIG. 1, E represents an electrically conducting support and D represents the polymerizable vinyl monomer layer, i.e., the resist-forming layer. In FIG. 2, A represents a glass layer provided with a conductive coating B such as tin oxide and C represents a photoconductor layer of high dark resistivity such as ZnO, ZnS or the like.

In actual operation, a D.C. voltage supply is connected across layers B (cathode) and E (anode) thereby creating a substantially, uniformly distributed electrical difference in potential across said anode and cathode layers. Without illumination, current of only a few microamperes which would in any case be insufficient to initiate polymerization flows through the system due to the high dark resistivity of the photoconductor layer. When exposed to a light pattern, however, an imagewise conductivity pattern is formed in the photoconductor layer which causes a corresponding increase in the flow of current between the cathode and anode to an extent sufficient to initiate the electrolysis reaction in monomer layer D whereby the chemical catalyst progenitor is converted into a species which initiates polymerization, e.g., free radical, anion and/or cation.

One of the truly outstanding features characterizing the process of the present invention relates to the fact that excepionally high-speed imagewise polymerizations are readily obtainable notwithstanding the use of minimal exposure levels, i.e., exposure which would require the use of eilther ultra high-intensity radiation sources or conversely, intolerably protracted time intervals if polymerization were to be effected to the same extent by utilizing photolytic methods of resist formation, i.e., wherein the polymerization reaction is a direct function of the light energy absorbed in the monomer layer. In contradistinction, the exposure required in practicing the present invention comprises but a fraction of those required in photolytic polymerization and need only be that necessary to render the photoconductor layer B conductive. Once the photoconductor material is excited in accordance with the light pattern impressed thereupon, a copious source of polymerization catalyst can be assured by merely controlling the current density, this being easily accomplished by suitable adjustment of the voltage impressed across the anode and cathode terminals. Since the catalyst-liberating electrolysis reaction in the monomer layer is a direct function of the number of coulombs impressed upon the system, means is thus provided for controlling the catalyst producing reaction rate and, concomitantly the rate of polymer formation virtually independently of the strength of the exposure radiation.

In photochemical methods of photopolymerization the exposure radiation performs a dual function, i.e., it provides both the information to be reproduced in the form of a light pattern and, in addition, represents both the ultimate and direct source of energy by which the catalyst-generating reaction is initiated. In contradistinction, the function of the exposure illuminant in the present invention is solely to supply the information desired to be reproduced in polymeric resist form, the direct energy source responsible for initiating the catalyst liberating reaction being the electric current conducted by those portions of the photoconductor layer activated by the exposure radiation. In this respect, the use of electric energy to produce the polymerization initiating species constitutes an amplification function, i.e., the image to be reproduced, though optically sensed initially by the photoconductor layer, is transmitted to the polymerizable monomer layer in the form of an amplified electric current. As will be readily apparent, this affords considerable latitude with regard to controlling the parameters which influence the polymerization reaction rate.

The electropolymerizable elements found to be eminently suitable for use in the present invention can comprise simply a conductive base coated with a resist forming monomer layer, the latter comprising as essential ingredients a polymerizable vinyl compound and a compound capable of liberating polymerization-initiating species when subjected to electrolysis. Any of the normally liquid to normally solid ethylenically unsaturated organic monomer compounds conventionally employed in photopolymerization processes are suitable in the practice of the present invention. Preferably, such compounds should contain at least one nonaromatic double bond between adjacent carbon atoms. Compounds particularly advantageous are the photopolymerizable vinyl or vinylidene compounds containing the $CH_2=C<$ grouping activated by direct attachment to an electronegative group such as halogen, C=O, —C≡N, —C≡C, —O—, etc. As examples of such photopolymerizable unsaturated organic compounds there may be mentioned in particular and without limitation, acrylamide, acrylonitrile, N-ethanol acrylamide, methacrylic acid, acrylic acid, calcium acrylate, methacrylamide, vinyl acetate, methylmethacrylate, methacrylate, ethylacrylate, vinyl benzoate, vinyl pyrrolidone, vinylmethyl ether, vinylbutyl ether, vinylisopropyl ether, vinylisobutyl ether, vinylbutyrate, butadiene or mixtures of ethylacrylate with vinyl acetate, acrylonitrile with styrene, butadiene with acrylonitrile and the like.

The above ethylenically unsaturated organic compounds or monomers as they are more commonly referred to may be used either alone or in admixture in order to vary the physical properties such as molecular weight, hardness, etc., of the final polymer. Thus, it is a recognized practice, in order to produce a vinyl polymer of the desired physical properties to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of Industrial and Engineering Chemistry, 1939. Among the cross-linking agents suitable for the purposes described herein there may be mentioned N,N′-methylene-bis-acrylamide, triacrylformal, triallyl cyanurate, divinyl benzene, divinyl ketones, diglycol diacrylate and the like. Generally speaking, increasing the quantity of cross-linking agent increases the hardness of the polymer obtained in the range wherein the weight ratio of monomer to cross-linking agent varies from 10:1 to 50:1.

In some instances, it may be desirable to employ an organic hydrophilic colloid carrier for the monomer/catalyst composition such as the type commonly used in the photographic art. Suitable colloid carriers for this purpose include without limitation polyvinyl alcohol, gelatin, casein, glue, saponified cellulose acetate, carboxymethyl cellulose, starch and the like. Preferably, the colloid is employed in amounts ranging from 0.5 to 10 parts by weight per part of monomer. It will be understood, however, that the monomer/catalyst composition may be applied as such, i.e., in the absence of a colloidal carrier, e.g., where the monomer employed is normally a solid. In such instances, the catalyst may be added to a preprepared solution of monomer in a suitable solvent prior to application to the support material. It has also been observed that the organic colloid likewise undergoes insolubilization and thus forms a portion of the resist matrix. This phenomena is particularly manifest with gelatin. Thus, the colloid carrier need not be inert in the sense of being totally unaffected by the catalytic effects of the polymerization-initiating species generated during the exposure intervals.

The catalyst compounds found to be eminently suitable for use in practicing the present invention encompass a wide variety of materials and in general comprise those compounds which possess the property of undergoing electrolysis to yield species capable of initiating the polymerization of vinyl monomers of the type more fully described hereinbefore. It is to be understood that the present invention is not limited in its practice to the use of a particular class or classes of chemical compounds as the catalyst liberating material since any substance possessed of the singular property that its electrolytic reaction or reactions include the generation of polymerization catalyst can be utilized to advantage. Accordingly, although critical to the present invention as regards the capacity to funtion in the above described manner, operable catalyst components of the type intended to be included herein are in no way critical from the standpoint of chemical classification.

The particular mechanism by which the generation of polymerization catalyst occurs in accordance with the present process is not self-evident and has not been definitely ascertained. However, investigation indicates that the catalyst materials contemplated for use herein are uniformly characterized in that their electrolysis reaction involves the formation not only of cation and anion species respectively, but free radicals as well. Necessarily, the catalyst-liberating materials are, to a greater or lesser extent, electrolytes and are thus capable of conducting some amount of electric current whether in liquid, molten or solution form. It further appears that the ionic species of the catalyst are further capable of yielding molecular and/or atomic species containing an unpaired electron, i.e., free radical. The mechanism involved can be illustrated diagrammatically according to the following series of reactions wherein NP represents the catalyst liberating compound in undissociated form $$\mathrm{NP} \rightleftharpoons \underset{(1)}{\mathrm{N}^-} + \underset{(2)}{\mathrm{P}^+}\text{(ionization)}$$

$$\mathrm{N}^- \xrightarrow{\text{electrolysis}} \underset{(3)}{\mathrm{N}\cdot} + \text{electron(anode)}$$

If N· is a molecular, as opposed to atomic species, further molecular dissociation to yield free radicals is a probable occurrence. It will thus be recognized that the catalyst species be it anion, cation or free radical may be either atomic or molecular and thus the term catalyst species as used herein is to be interpreted accordingly.

Although the polymerization of the vinyl monomer composition can be initiated by any of the above radical species, (1), (2), (3), i.e., anionic, cationic and/or free radical, considerable study of the reaction mechanism would tend to indicate that the predominant portion of the polymerization reaction is free-radical induced. For example, it has been observed that the polymerization reaction occurs mainly at the inter-face between the monomer layer and anode, i.e., conductive support. However, it will be understood that the foregoing merely represents an exposition of current theory on the subject and accordingly, is to be so interpreted. In any event, it is quite possible that polymerization proceeds by the superposition of both free-radical and ionic mechanisms. This hypothesis finds support in the published literature relating to studies conducted in connection with electrochemical methods of polymerization-initiation. In this regard, reference is made to the article "Electrochemical Initiation of Polymerization" appearing in Pure and Applied Chemistry 4, p. 245 (1962). It will thus be understood that the term "polymerization initiating species" is intended to be descriptive of free radicals as well as ions.

As indicated previously, the essential requirement with respect to operable catalyst liberating materials is that their electrolysis reaction include the formation of polymerization-initiating catalyst species and that the catalyst species thus formed be capable of initiating the polymerization reaction. The speed of polymer formation will depend on the ease of electrolysis and the efficiency of the polymerization initiator that forms by electrolysis. The ease of electrolysis is not a particularly critical factor with one obvious qualification; namely, the threshold current value necessary for electrolysis at least to an extent sufficient to initiate polymerization should not correspond to that amount of current "leakage" which flows through the system with the electric circuit closed and in the absence of illuminant. Otherwise, some amount of polymer would form throughout the monomer layer resulting in the formation of what could be suitably termed by way of analogy to silver halide photography, a fog density. Otherwise expressed, the dark current value of the system, i.e., the current which flows through the system in the absence of illuminant, should be insufficient to result in the formation of polymer. In accordance with the present invention and within the limitations expressed in respect of the type of monomer employed, the concentration of catalyst-liberating material, etc., it has been determined that current values in excess of 300 microamperes/$cm.^2$ are necessary for polymer formation in the monomer layer. Thus, the voltage impressed upon the conductive sandwich arrangement of conductive base, monomer coating and photoconductor layer during exposure should be controlled so as to provide current values in the nonexposed areas (dark current areas) on the order of 300 microamperes/$cm.^2$ and less. This can be accomplished by applying a potential to the sandwich arrangement for the production of image-wise resists within the range of from about 50 to about 300 volts D.C., with a range of 100 to 250 volts being particularly preferred. Higher voltage values can be used if permitted as long as the layers comprising the conductive sandwich arrangement not be deleteriously affected thereby, e.g., decomposition of the materials employed.

Polymerization catalyst-progenitors suitable for use in the present invention encompass a wide variety of materials. As stated previously, any compound which yields upon electrolysis molecular and/or atomic species whether in the form of ions and/or free radicals capable of initiating the polymerization of vinyl type monomers are eminently suitable. Representative classes of the materials found to so function include, without limitation, the aliphatic saturated mono- and di-carboxylic acids, preferably containing from 1 to 20 carbon atoms, as well as their salts, e.g., with water-solubilizing cations such as sodium, potassium, ammonium and the like. As particular examples of such compounds, there may be mentioned the following:

| | |
|---|---|
| Formic acid | Decanoic acid |
| Acetic acid | Undecanoic acid |
| Propionic acid | Dodecanoic acid |
| Butyric acid | Tridecanoic acid |
| Valeric acid | Tetradecanoic acid |
| Caproic acid | Pentadecanoic acid |
| Heptylic acid | Hexadecanoic acid |
| Caprylic acid | Heptadecanoic acid |
| Pelargonic acid | Octadecanoic acid |

The carboxylic acid compound may contain further substituents such as halogen, e.g., chlorine, bromine, etc., nitro, amino, alkyl, hydroxyalkyl, etc. Examples of such substituted carboxylic acids include, without limitation, the following:

Bromoacetic acid
Dibromoacetic acid
Tribromoacetic acid
Chloroacetic acid
Trimethylacetic acid
Oxalic acid
Succinic acid
N,N-bis(2-hydroxyethyl)glycine Hydrohalogen acids as well as their water-soluble salts represent an additional class of highly useful catalyst-liberating materials. Particular representatives include without limitation the following:

Hydrochloric acid
Hydrobromic acid
Sodium bromide
Lithium bromide
Potassium bromide
Ammonium bromide
Tetraethylammonium bromide
Tetramethylammonium bromide
Sodium chloride
Lithium chloride
Potassium chloride
Ammonium chloride
Tetraethylammonium chloride
Tetramethylammonium chloride Excellent results can also be obtained with compounds commonly referred to in the art as surface active agents such as the aryl and long chain alkyl sulfates and sulfonates; alkaryl sulfates and sulfonates; the alkyl, aryl and alkaryl polyether sulfates and sulfonates, the diaryl, di-(alkaryl) and dialkyl mono- and polyether sulfates and sulfonates, etc. Specific examples of such compounds include without limitation, the following:

Sodium doceyldiphenylether disulfonate
Sodium tridecylbenzene sulfonate
Sodium dodecylbenzene sulfonate
Sodium dodecylnaphalene sulfonate
Sodium lauryl sulfate
Magnesium lauryl sulfate
Sodium cetyl sulfate
Sodium tridecyl sulfate
Sodium 7-ethyl-2-methyl-4-undecanol sulfate Other inorganic compounds found to be useful catalyst-liberating materials include for example, the alkali-metal borohydrides, e.g., sodium borohydride. This compound is converted into a species that initiates vinyl polymerization as a result of the electrolysis of water. Apparently, the anodic reaction of such compounds includes the oxidation of hydroxyl ions thus rendering the immediate environs of the anode acidic. Borohydride anion, under acidic conditions hydrolyzes according to the following equation:

$$H_3O^+ + BH_4^- \rightarrow BH_3 + H_2O + H_2$$

The borane which forms is extremely unstable and capable of initiating vinyl polymerization. Other substances found to function as suitable catalyst-liberating materials include the nitrates of sodium, potassium, silver, ammonium and the like. Beneficial results are obtained with the use of etherified polymeric starches as the binder material, such as the product carrying the trade name designation "Ceron N" available commercially from the Hercules Powder Company.

The dissociation reaction characterizing the electrolysis of compounds of the above type can be represented according to the following mechanism, using acetic acid as an example:

$$CH_3COOH \rightleftharpoons CH_3COO^- + H$$
$$CH_3COO^- \rightarrow CH_3COO\cdot + \text{electron}$$

The acetoxy free radical thus formed is capable of further molecular dissociation to yield a methyl free radical according to the following equation:

$$CH_3COO\cdot \longrightarrow CH_3^{\cdot} + CO_2$$

Either the acetoxy or methyl free radical is capable of initiating the resist-forming polymerization reaction.

When using, for example, trichloroacetic acid as the catalyst liberator, the identical reaction mechanism is involved except, of course, that the free radical species produced would be correspondingly trichloroacetoxy and trichloromethyl both of which are effective addition polymerization initiators.

The amount of catalyst material employed is not particularly critical so long as it is present in amounts sufficient to initiate as well as maintain the desired rate of polymerization. However, optimum realization of results provided herein can be obtained by the use of the catalyst liberating compound in amounts ranging from approximately 0.5 part to 50 parts per 100 parts of monomer. It will further be understood that such catalyst compounds may be employed singularly or in admixture.

The significance of the above depicted reaction mechanism within the specific context of the process described herein can be amplified as follows: The resist-forming polymerization reaction is essentially anodic, i.e., under the influence of the electric current generated during the light exposure, the anion species, e.g., acetoxy, trichloroacetoxy, etc., is impelled, i.e., migrates to the anode (layer B in FIG. 2) whereupon it surrenders its ionic charge, i.e., electron and is thus transformed into a free radical. Imagewise build-up of polymer thus occurs at the interface between the monomer layer and the conductive support, in accordance with the free radical population density which in turn is determined by the current density. Anodic polymerization is preferred over cathodic polymerization since the latter reaction would require that polymerization be effected throughout the entire monomer layer in order to obtain an adherent polymeric resist image. This, of course, presents the disadvantage of requiring correspondingly prolonged exposure intervals. Following exposure, the image may be developed by removing unpolymerized monomer by means of water or other suitable solvents.

This procedure may be used in any number of commercial applications. Thus, it may be employed to produce relief printing plates, negative working offset plates or the like. By staining the resist or coating with black or colored inks or dyestuffs or by dispersing a colloidal carbon in the monomeric emulsion, the image density can be increased. Moreover, a white pigment such as titanium dioxide can be incorporated into the monomer layer and coated upon a black conducting surface such as a carbon coated film support. Negatives or positives for direct inspection can thus be made by removal of the soluble unpolymerized parts.

In addition to the above uses, the present invention can be extended to the preparation of printing materials, image transfer materials, printing masks, photolithographic printing plates of all types, lithographic cylinders, printing stencils and printed circuits, etc.

The polymerizable vinyl monomer composition thus produced can be readily applied to the conductive base material by any suitable coating operation, e.g., flow coating.

It is preferred that the vinyl monomer composition be deposited upon the conductive support to a thickness within the range of from about 5 to about 100 microns. Although the thickness of the layer thus deposited is not particularly critical, it should nevertheless be maintained within the aforestated range in order to assure the obtention of optimum results. In general, thinner coatings produce higher photocurrents and are thus conducive to higher speed resist formation.

Any conductive support may be employed as the base for the vinyl monomer coating, it only being necessary that electrical contact be established with the conductive surface during the exposure. Thus, for example, a carbon coating may be used on conventional film base supports. Metal, e.g., aluminum, may also be used as the conductive medium on which the electropolymerizable layer is coated. In addition, paper may be rendered electrically conductive by impregnation with carbon particles or by incorporation of suitable electrolytes at the time of manufacture. The support for the photoconductive coating may be glass or plastic on which is vacuum-evaporated or otherwise deposited a very thin film of metal such as electrically conducting glass commercially available and known as Nesa cork glass. In the latter case, it is desirable that the metal layer be thin enough so that it is at least 70% to 75% transparent to light.

The thickness of the conductive support is likewise not particularly critical so long as the surface in contact with the monomer layer be suitably conductive. In general, it is found that optimum results can be obtained by selecting as the conductive base a material having a resistivity of less than 130 ohm-cm.

The nature of the photoconductive insulating layer (layer C in FIG. 2) is likewise not a critical factor in the practice of the present invention so long as it possess a high dark resistivity on the order of at least $10^{10}$ ohm-cm. and, of course, that it be rendered conductive when exposed to electromagnetic radiation having a wave length ranging from the ultra-violet through the visible region of the spectrum. Such materials are, of course, well known in the art. As examples of photoconductive insulating layers suitable for use herein there may be mentioned in particular and without limitation vacuum evaporated vitreous selenium and mixtures of insulating resins with photoconductors selected from the class of inorganic luminescent or phosphorescent compounds such as zinc oxide, zinc sulfide, zinc cadmium sulfide, cadmium sulfide and the like. These compounds may be suitably activated in well known manner with manganese, silver, copper, cadmium, cobalt, etc. Examples of these include mixed cadmium-sulfide zinc-sulfide phosphors, formerly commercially available from the New Jersey Zinc Company under the names Phosphor 2215, Phosphor 2225, Phosphor 2304, and zinc sulfide phosphors under the names Phosphor 2200, Phosphor 2205, Phosphor 2301, and Phosphor 2330, also copper activated cadmium sulfide and silver activated cadmium sulfide available from the U.S. Radium Corporation under the names cadmium sulfide color number 3595 and cadmium sulfide number 3594, respectively; also zinc oxide available from the New Jersey Zinc Co., under the trade name Florence Green Seal No. 8 and zinc oxide available from the St. Joseph Lead Co. under the trade name St. Joe Zinc Oxide Grade 320–PC. As is well known, the zinc oxide normally employed in such photoconductive layers has its greatest sensitivity in the ultra-violet region of the spectrum whereas conventional light sources have relatively weak radiation in the same region. However, the sensitivity of the zinc oxide may be extended to the visible region of the spectrum by the incorporation of suitable sensitizing dyes capable of imparting response or sensitivity to the longer wave length radiation.

As examples of insulating binders found to be eminently suitable for the preparation of the photoconductive layer, mention may be made of the silicone resins such as DC–801, DC–804, and DC–996, manufactured by the Dow Corning Corporation, and SR–82, manufactured by the General Electric Corporation; acrylic and methacrylic ester polymers such as Acryloid A 10 and Acryloid B 72 supplied by the Rohm and Haas Co.; epoxy ester resins such as Epidene 168, sold by the T. F. Washburn Corp., etc.

As mentioned hereinbefore, the principal advantage made possible by the present invention relates to the manifold increase in speed obtainable by virtue of the fact that the incident exposure light energy is converted into electric energy and thereafter amplified to the extent desired in accordance with the particular speed requirements of the process. More specifically, the incident light is converted into charge carriers (current) by the photoconductor layer.

Without intending to be bound by any theory, it has nevertheless been postulated in explanation of the amplifying characteristics of photoconductors that such materials when excited by the impingement of light rays function in a manner comparable to the operation of an electric amplifying device whereby one quantum of light energy (Photon) can be converted into more than one charge carrier. The measure of this conversion is gain (G) which is defined as the number of charge carriers that pass between the electrodes per second for each Photon of light energy absorbed per second. Gain values for the electrophotopolymerizable systems provide herein are found to be greater than unity. In essence then, the utilization of light energy to produce electric current which in turn generates polymerization initiator via the electrolysis of electrochemical catalyst material represents an amplification step. The gain value is, of course, indicative of the degree of amplification. Thus, if a gain value of 100 is representative of a given electrophotopolymerizable system, this would signify the formation of about 100 polymerization initiating species from one photon of light energy.

The amplifying characteristics of the crystals comprising the photoconductor is probably due to the fact that such materials, e.g., cadmium sulfide, cadmium selenide and the like comprise excess electron or electron donor type semiconductor crystals. As a consequence, the excess energy necessary to produce the amplified current in the crystal is derived from the electron producing character of the material itself when irradiated by exposure to light rays. It is thought that electron donor centers in each crystals are ionized by the light rays thus forming stationary positive space charges. In the crystal the conduction electrons are to a large extent localized in the traps, thus forming the current reducing stationary negative space charge. When the ray impinges the electron, donors are ionized thus assuming a positive charge. One positive hole so created in the crystal appears to control the flow of more than 10,000 electrons through the crystal. Consequently, electrical energy is released in the form of current in the crystal that is many times the energy applied to the crystal by the light ray.

The following examples are given for purposes of illustrating the present invention in greater detail. However, it is to be understood that such examples are presented for purposes of illustration only and accordingly, are not to be regarded as limiting the invention.

A comparison of the relative speeds characterizing the electrophotopolymerization process of the present invention with the photopolymerization systems currently practiced in the art is illustrated in the following example:

EXAMPLE 1

A photopolymerizable coating composition of the following formulation is coated onto a subbed polycarbonate (Plestar) film base:

| | |
|---|---|
| Gelatin, 15% solution ____ml__ | 33 |
| Acrylated gelatin ____g__ | 2.5 |
| Saponin, 8% solution ____ml__ | 34.5 |
| Benzyl alcohol ____g__ | 5 |
| Tricresylphosphate ____g__ | 5 |
| Nigrosine ESB ____g__ | 3 |
| Graphtol yellow ____g__ | 7.8 |
| Polyvinylpyrrolidone, 10% solution ____g__ | 15.6 |
| Sodium dodecyl sulfate (Wetsit), 10% solution ____ml__ | 10.5 |
| Methylenebisacrylamide ____g__ | 1.4 |
| Ferric ammonium citrate, 36% solution ____ml__ | 20 |
| Water ____ml__ | 20 |

Following photoexposure, the coating is immersed in a dilute hydrogen peroxide solution and then washed with hot water to remove unreacted monomer. The coating is originally colored black and therefore the polymer that remains after processing is readily visible.

The monomer coating used in electrophotopolymerization is prepared by coating the following solution on an aluminum sheet with a #32 wire wound bar:

| | |
|---|---|
| Methylenebisacrylamide ____g__ | 1.4 |
| Gelatin, 20% solution ____ml__ | 50 |
| Glycerine ____ml__ | 2 |
| Ammonium bromide ____mg__ | 200 |
| Sodium tetradecyl sulfate (Tergitol-4, a 30% aqueous solution of the sodium sulfate derivative of 7-ethyl-2-methyl-4-undecanol available commercially from Union Carbide Corp.) ____g__ | 4 |

The coating is sandwiches with a coating of dye sensitized zinc oxide in silcone resin SR-82 at a pigment-to-resin ratio of 3:1. The support for the coating is nesa-coated glass which served as the cathode while the aluminum sheet served as the anode. The arrangement is imaged through a $\sqrt{2}$ Stouffer Graphic Arts Step Wedge for 5 seconds from a 500 watt bulb at a color temperature at 2850° K. placed at a distance of 20 inches. During exposure a potential of 250 volts D.C. is applied. The monomer coating is then washed in hot water and then dyed by immersion into a Nigrosine ESB (General Aniline and Film Corp.) solution. Nine steps of the step wedge were visible on the treated coating. The photopolymerizable coating is exposed under identical conditions to the same light source for a period of 60 seconds. After processing, only 4 steps of the step wedge were visible on the treated coating. The foregoing results established that the process and compositions of the present invention make possible an approximately seventy-fold increase in speed when compared to conventional photopolymerization methods.

EXAMPLE 2

The following composition was prepared.

Monomer solution:

| | |
|---|---|
| Acrylamide (recrystallized) ____g__ | 180.0 |
| N,N'-methylenebisacrylamide ____g__ | 7.0 |
| Water ____ml__ | 120.0 |

To 6 milliliters of the above composition were added the following ingredients in the amounts shown:

| | |
|---|---|
| Aqueous gelatin solution, 20% ____ml__ | 50 |
| Glycerine ____ml__ | 2 |
| Ammonium bromide ____mg__ | 400 |

The mixture was flow-coated on a thin aluminum sheet and allowed to dry at room temperature. Its resistivity after air drying was $10^7$ ohms/square. This coating constituted the electropolymerizable layer.

A dye sensitized zinc oxide photoconductive layer, approximately 60 microns thick, was next deposited on a sheet of Nesa coated glass and allowed to dry in air for about 15 minutes, followed by baking in a 100° C. oven for one hour. The binder employed was GE Silicone Resin SR-82, and a mixture of toluene and methanol was used as solvent to adjust the mixture to the proper viscosity for coating. The photoconductive surface was then placed in intimate contact with the electropolymerizable layer. A 375-watt photoflood lamp was next positioned approximately 12 inches from the glass side of the photoconductive element while simultaneously applying a potential of 100 volts to the assembly. The aluminum support was made the anode and the conducting surface of the Nesa glass served as the cathode. Following an exposure of 5 seconds, the monomer coating was washed with hot water. A raised image of the line negative was discernible on the aluminum sheet after this treatment. It was easily dyed to a deep blue image, when placed for several seconds in a 1% solution of Brilliant Wool Blue FFRA, Ex CF dye (General Aniline and Film Corporation).

EXAMPLE 3

To 6 ml. of the monomer solution, described in Example 2, were added the following ingredients in the amounts shown:

| | |
|---|---|
| Aqueous gelatin solution, 20% ____ml__ | 50 |
| Glycerine ____ml__ | 3 |
| Ammonium chloride ____mg__ | 200 |

A coating was prepared as in Example 2. Its resistivity was $10^8$ ohms/square. When exposed for 30 seconds and processed as in Example 2 a raised image was produced on the aluminum sheet.

EXAMPLE 4

The following ingredients in the amounts shown were added to 6 ml. of the monomer solution described in Example 2.

| | |
|---|---|
| Aqueous gelatin solution, 20% ____ml__ | 50 |
| Glycerine ____ml__ | 2 |
| N,N-bis(2-hydroxyethyl)glycine ____mg__ | 50 |

The mixture was flow-coated on a thin aluminum sheet and allowed to dry at room temperature. Its resistivity was $10^7$ ohms/square. A raised image was produced on the aluminum sheet by the procedure described in Example 2 except that the exposure time was 3 minutes.

EXAMPLE 5

This example illustrates the use of a catalyst mixture comprising sodium bromide and the sodium sulfate derivative of 7-ethyl-2-methyl-4-undecanol. To 6 ml. of the monomer solution, described in Example 2, were added the following ingredients in the amounts shown:

| | | |
|---|---|---|
| Aqueous gelatin solution, 20% | ml | 50 |
| Glycerine | ml | 2 |
| Sodium bromide | mg | 200 |
| Sodium sulfate derivative of 7-ethyl-2-methyl-4-undecanol | g | 4 |

After flow-coating the mixture on a thin aluminum sheet and allowing the composition to dry at room temperature, its resistivity was $10^8$ ohms/square. A raised image was produced on the aluminum sheet by the procedure of Example 1, except that the exposure time was 5 seconds. This monomer coating was also used to record continuous tone images. By the same procedure, a 10 second light exposure of the photoconductive coating through an image negative having a wide tonal range reproduced the image on the aluminum sheet.

EXAMPLE 6

This example illustrates the use of a catalyst mixture comprising sodium chloride and sodium dodecyldiphenyletherdisulfonate. To 6 ml. of the monomer solution, described in Example 2, were added the following ingredients in the quantities shown:

| | | |
|---|---|---|
| Aqueous gelatin solution, 20% | ml | 50 |
| Glycerine | ml | 2 |
| Sodium chloride | mg | 200 |
| Sodium dodecyldiphenyletherdisulfonate (Benax-2Al manufactured by Dow Chemical Co.) | g | 2 |

The mixture was flow-coated on a thin aluminum sheet and allowed to dry at room temperature. Its resistivity was $10^8$ ohms/square. A raised image was produced on the aluminum sheet by the procedure described in Example 2, except that the exposure time was 5 seconds.

EXAMPLE 7

This example illustrates the use of ammonium bromide as the catalyst and an etherified polymeric carbohydrate as the binder.

The following composition was added to 6 ml. of the monomer solution, described in Example 2.

| | | |
|---|---|---|
| Aqueous gelatin solution, 20% | ml | 37.5 |
| Aqueous Ceron N solution, 20 (etherified polymeric carbohydrates manufactured by Hercules Powder Co.) | ml | 12.5 |
| Glycerine | ml | 2.0 |
| Ammonium bromide | mg | 300.0 |

A coating was made on a thin aluminum sheet, which after drying at room temperature exhibited a resistivity of $10^9$ ohms/square. It was exposed and processed as in Example 2, except that the exposure time was one second and the applied potential was 200 volts. A raised image on the aluminum sheet resulted.

EXAMPLE 8

This example illustrates the use of a polyethylenimine as the carrier. To 6 ml. of the monomer solution, described in Example 2, were added the following ingredients in the amounts shown:

| | | |
|---|---|---|
| Aqueous polyethylenimine solution, 20% (manufactured by Dow Chemical Co., molecular weight of approx. 1000) | ml | 50 |
| Glycerine | ml | 2 |
| Ammonium bromide | mg | 200 |

The coating, prepared as in Example 2, was found to have a resistivity of $10^8$ ohms/square. A raised image was produced on the aluminum sheet by the procedure described in Example 2, except that the exposure time was 30 seconds.

EXAMPLE 9

This example illustrates the use of a catalyst mixture comprising the sodium sulfate derivative of 7-ethyl-2-methyl-4-undecanol and sodium alkylarylsulfonate. The following composition was prepared.

Monomer solution:

| | | |
|---|---|---|
| Acrylamide (recrystallized) | g | 180 |
| N,N'-methylenebisacrylamide | g | 7 |
| Water | ml | 120 |

To 6 milliliters of the above composition were added the following ingredients in the amounts shown:

| | | |
|---|---|---|
| Aqueous gelatin solution, 20% | ml | 50 |
| Glycerine | ml | 2 |
| Sorapon SF[1]-78[a] | g | 1.25 |
| Tergitol-4 | g | 2 |

[1] Sorapon SF-78 (General Aniline and Film Corp.) is an 85% aqueous solution of sodium-alkylarylsulfonate.

The mixture was flow coated on a thin aluminum sheet and allowed to dry at room temperature.

A dye sensitized zinc oxide photoconductive coating approximately 45 microns thick was next deposited on a sheet of Nesa coated glass and allowed to dry overnight at room temperature. The binder employed as GE Silicone Resin SR-82 and a mixture of toluene and methanol was used as solvent to adjust the mixture to the proper viscosity for coating. The photoconductive surface was then placed in intimate contact with the electropolymerizable layer. The glass side of the photoconductive element was then imaged by light from a 375 watt photoflood lamp placed at a distance of 12 inches. Simultaneously, a potential of 100 volts was applied to the assembly. The aluminum support was made the anode and the conducting surface of the Nesa glass served as the cathode. After a one second exposure, the monomer coating was washed with hot water. An image was discernible on the aluminum sheet after this treatment. It was easily dyed to a black image when placed for several seconds into a 1% solution of Nigrosine ESB (General Aniline and Film Corp.).

EXAMPLE 10

To 6 ml. of the monomer solution, described in Example 9, were added the following ingredients in the amounts shown:

| | | |
|---|---|---|
| Aqueous gelatin solution, 20% | ml | 50 |
| Glycerine | ml | 2 |
| Tergitol-4 | g | 4 |

A coating was prepared as in Example 9. When exposed for 3 seconds and processed as in Example 9, an image was produced on the aluminum sheet.

EXAMPLE 11

This example illustrates the use of hydroxyethyl cellulose as the colloid carrier. The following composition is prepared.

Monomer solution:

| | | |
|---|---|---|
| Acrylamide (recrystallized) | g | 180 |
| N,N'-methylenebisacrylamide | g | 7 |
| Water | ml | 120 |

To 0.6 milliter of the above composition are added the following ingredients in the amounts shown:

| | | |
|---|---|---|
| Hydroxyethyl cellulose | ml | 50 |
| Glycerine | ml | 0.2 |
| Ammonium bromide | mg | 20 |

A dye sensitized zinc oxide photoconductive coating approximately 45 microns thick is deposited on a sheet of Nesa coated glass and is allowed to dry overnight at room temperature. The binder employed is G.E. Silicone Resin SR-82 and a mixture of toluene and methanol are used as solvent to adjust the mixture to the proper viscosity for coating. The photoconductive surface is placed in intimate contact with the electropolymerizable layer.

The glass side of the photoconductive element is then imaged by light from a 375 watt photoflood lamp placed at a distance of 12 inches. Simultaneously, a potential of 100 volts is applied to the assembly. The aluminum support is the anode and the conducting surface of the Nesa coated glass is the cathode. After a 10 second exposure, the monomer coating is washed with hot water. An image is discernible on the aluminum sheet after this treatment. It is easily dyed to a black image, when placed for several seconds into a 2% solution of Phenamine Black E dye (General Aniline and Film Corporation) in Cellosolve-water 1:5.

EXAMPLE 12

This example illustrates the use of triacrylformal as the monomer and polyvinyl alcohol as the carrier. The following mixture is flow coated on a thin aluminum sheet and allowed to dry at room temperature:

| | | |
|---|---|---|
| Polyvinyl alcohol solution, 20% | ml | 50 |
| Triacrylformal | g | 1 |
| Glycerine | ml | 2 |
| Ammonium bromide | mg | 200 |

After exposing for 1½ minutes and processing as in Example 11, an image is produced on the aluminum sheet.

EXAMPLE 13

This example illustrates the use of tetraethylammonium bromide as the catalyst material. To 6 ml. of the monomer solution, described in Example 11, are added the following ingredients in the amounts shown:

| | | |
|---|---|---|
| Gelatin solution, 20% | ml | 50 |
| Glycerine | ml | 2 |
| Tetraethylammonium bromide | g | 1 |

A coating is prepared as in Example 11. After exposing and processing as in Example 11, a raised polymeric image is produced on the aluminum sheet.

EXAMPLE 14

This example illustrates the use of a diaryl ether disulfonate as the catalyst material. To 6 ml. of the monomer solution, described in Example 11, are added the following ingredients in the amounts shown:

| | | |
|---|---|---|
| Gelatin solution, 20% | ml | 50 |
| Glycerine | ml | 2 |
| Benax-2Al solution (from Dow Chemical Co. and is a 45% aqueous solution of sodium dodecyldiphenylether disulfonate) | g | 2 |

A coating is prepared as in Example 11. After exposing and processing as in Example 11, an image is produced on the aluminum sheet.

EXAMPLE 15

To 6 ml. of the monomer solution, described in Example 11, are added the following ingredients in the amounts shown:

| | | |
|---|---|---|
| Gelatin solution, 20% | ml | 50 |
| Glycerine | ml | 2 |
| Ammonium bromide | mg | 200 |
| Sorapon SF-78 (from General Aniline and Film Corp. and is 85% sodium alkylaryl sulfonate) | g | 1.2 |

A coating is prepared as in Example 11. A photoconductive coating of cadmium sulfide silver activated type from United States Radium Corp. is prepared on Nesa coated glass using Silicone Resin SR-82 as the binder. The pigment-to-resin ratio is 5:1.

After the two coatings are placed together, exposed and processed as in Example 11, an imagewise resist is produced on the aluminum sheet.

EXAMPLE 16

Example 11 is repeated except that the ammonium bromide is replaced by potassium nitrate. Following exposure an image is discernible on the aluminum sheet after washing with hot water. Again, the resist image is easily dyed when placed for several seconds in a 2% solution of phenamine Black E dye (General Aniline & Film Corp.) in Cellosolve-water 1:5.

Results similar to those described above are obtained when the procedures described in the foregoing examples are repeated but employing in lieu of the specific monomers exemplified, the following materials:

Methacrylic acid
Acrylic acid
Calcium acrylate
Methacrylamide
Vinyl acetate
Acrylyl pyrrolidone
Vinyl pyrrolidone, etc.

The present invention has been disclosed with respect to certain preferred embodiments thereof, and there will become obvious to persons skilled in the art various modifications, equivalents or variations thereof which are intended to be included within the spirit and scope of this invention.

What is claimed is:

1. A process of photoelectropolymerization which comprises exposing a photoconductor layer having a high dark resistivity to electromagnetic radiation having a wave length extending from the ultraviolet through the visible region, said photoconductor layer being disposed in electrically conducting contact with a vinyl monomer layer coated on an electrically conductive support, said monomer layer comprising (a) a normally liquid to normally solid vinyl monomer containing the grouping $CH_2{=}C{<}$ attached directly to an electronegative group and (b) a catalyst progenitor comprising a compound which undergoes electrolysis with the formation of polymerization-initiating species capable of initiating the polymerization of said vinyl monomer and wherein an electrical potental difference is maintained across said photoconductor layer and said conductive support throughout the exposure interval, said potential difference being substantially uniformly distributed over each of said photoconductor and conductive support whereby current is caused to flow through said monomer layer thereby effecting polymerization of said vinyl monomer layer.

2. A process according to claim 1 wherein said vinyl monomer comprises acrylamide.

3. A process according to claim 1 wherein said catalyst progenitor comprises ammonium bromide.

4. A process according to claim 1 wherein said catalyst progenitor comprises acetic acid.

5. A process according to claim 1 wherein said catalyst progenitor comprises trichloroacetic acid.

6. A process for the preparation of a polymeric resist image wherein polymer formation is controlled in accordance with an imagewise conductivity pattern which comprises exposing a photoconductive layer having a high dark resistivity to electromagnetic radiation having a wave length extending from the ultraviolet through the visible region whereby said photoconductor layer is rendered capable of conducting an electric current in the exposed areas, said photoconductor layer being disposed in electrically conducting contact with a vinyl monomer layer coated on an electrically conductive support, said monomer layer comprising (a) a normally liquid to normally solid vinyl monomer containing the grouping $CH_2{=}C{<}$ attached directly to an electronegative group and (b) a catalyst progenitor comprising a compound which undergoes electrolysis with the formation of species capable of initiating the polymerization of said vinyl monomer and wherein an electrical potential difference is maintained across said photoconductor layer and said conductive support throughout the exposure interval, said potential difference being substantially uniformly distributed over each of said photoconductor layer and said conductive support whereby current is caused to flow through said monomer layer thereby effecting polymerization of the said vinyl monomer in areas corresponding to the exposed areas of said photoconductor layer, and removing the unpolymerized portions of said monomer layer to form a polymeric resist image.

7. A process according to claim 6 wherein said monomer and catalyst progenitor are dispersed throughout a hydrophilic colloid carrier.

8. A process according to claim 7 wherein said hydrophilic colloid carrier is gelatin.

9. A process according to claim 6 wherein said vinyl monomer comprises acrylamide.

10. A process according to claim 6 wherein said catalyst progenitor comprises ammonium bromide.

11. A process according to claim 6 wherein said catalyst progenitor comprises acetic acid.

12. A process according to claim 6 wherein said catalyst progenitor comprises trichloroacetic acid.

13. A process according to claim 6 wherein said monomer layer further contains a cross-linking agent having at least two terminal vinyl groups.

14. A process according to claim 13 wherein said cross-linking agent is selected from the group consisting of N,N′-methylene-bis-acrylamide, triacrylformal, triallyl cyanurate, divinyl benzene, divinyl ketones and diglycol diacrylate.

15. A process according to claim 6 wherein said catalyst progenitor comprises ammonium chloride.

16. A process according to claim 6 wherein said catalyst progenitor comprises N-N-bis-(2-hydroxyethyl) glycine.

17. A process according to claim 6 wherein said catalyst progenitor comprises sodium chloride and sodium diphenylether.

18. A process according to claim 6 wherein said catalyst progenitor comprises ammonium nitrate.

19. A process according to claim 6 wherein said catalyst progenitor comprises sodium-7-ethyl-2-methyl-4-undecanol sulfate.

20. A process according to claim 6 wherein said catalyst progenitor comprises tetraethyl ammonium bromide.

21. A process according to claim 4 wherein said catalyst progenitor comprises a water-soluble salt of acetic acid.

22. A process according to claim 6 wherein said catalyst progenitor comprises a water-soluble salt of acetic acid.

23. A process according to claim 22 wherein said catalyst progenitor comprises sodium acetate.

References Cited

UNITED STATES PATENTS

| | | | |
|---|---|---|---|
| 3,050,390 | 8/1962 | Levinos et al. | 96—35 |
| 3,099,558 | 7/1963 | Levinos | 96—35 |
| 3,316,088 | 4/1967 | Schaffert | 96—1.5 |
| 3,326,680 | 6/1967 | Garrett | 96—1 |
| 3,348,944 | 10/1967 | Michalchek | 96—1.8 |

NORMAN G. TORCHIN, *Primary Examiner.*

J. C. COOPER III, *Assistant Examiner.*

U.S. Cl. X.R.

96—1.5, 35.1, 115

Disclaimer

3,436,215.—*Steven Levinos* and *Albert S. Deutsch,* Vestal, N.Y. PHOTO-POLYMERIZATION INITIATED BY ELECTROLYSIS OF A CATALYST PROGENITOR EXPOSED THROUGH A PHOTO-CONDUCTIVE LAYER. Patent dated Apr. 1, 1969. Disclaimer filed Sept. 30, 1982, by the assignee, *Eastman Kodak Co.*

Hereby enters this disclaimer to all claims of said patent.

[*Official Gazette March 21983.*]